United States Patent [19]

McTeer

[11] Patent Number: 5,700,718

[45] Date of Patent: Dec. 23, 1997

[54] METHOD FOR INCREASED METAL INTERCONNECT RELIABILITY IN SITU FORMATION OF TITANIUM ALUMINIDE

[75] Inventor: Allen McTeer, Boise, Id.

[73] Assignee: Micron Technology, Inc., Boise, Id.

[21] Appl. No.: 596,639

[22] Filed: Feb. 5, 1996

[51] Int. Cl.$^6$ .................................................. H01L 21/44
[52] U.S. Cl. ........................ 437/192; 437/194; 437/190; 437/245
[58] Field of Search ............................. 437/192, 194, 437/190, 197, 198, 245, 246

[56] References Cited

U.S. PATENT DOCUMENTS

| 4,154,874 | 5/1979 | Howard et al. | 427/91 |
| 5,225,372 | 7/1993 | Sawkar et al. | 437/190 |
| 5,380,678 | 1/1995 | Yu et al. | 437/190 |
| 5,494,860 | 2/1996 | McDevitt et al. | 437/246 |

FOREIGN PATENT DOCUMENTS

| 63-142832 | 6/1988 | Japan . |
| 5090268 | 4/1993 | Japan . |

OTHER PUBLICATIONS

Ono et al. "Development of a Planarized Al–Si Contact Filling Technology" 1990 Proc. 7th International IEEE VLSI Multilevel Interconnect Conf. (Jun. 1990, Calif.) pp. 76–82.

Primary Examiner—David Graybill
Assistant Examiner—C. Everhart
Attorney, Agent, or Firm—Workman, Nydegger & Seeley

[57] ABSTRACT

Disclosed is a method for in situ formation of titanium aluminide. The disclosed method is directed to overcoming voiding problems which result in conventional titanium and aluminum metal interconnect stacks. The steps of the method comprise first providing a silicon substrate, which typically comprises an in-process integrated circuit wafer. Next, an insulating passivation layer is provided on the silicon substrate. The next step is the sputtering of a titanium layer of a given thickness over the passivation. Subsequently, an aluminum film of three times the thickness of the titanium layer is sputtered over the titanium layer. The next step comprises annealing the titanium layer and the aluminum film in situ in a metal anneal chamber to form titanium aluminide. Following the in situ anneal, the remainder of the needed aluminum is sputtered over the titanium aluminide and a further passivation layer of titanium nitride is then sputtered over the aluminum. Finally, the entire wafer is annealed in a furnace, thereby completing the metal interconnect stack.

17 Claims, 1 Drawing Sheet

METHOD FOR INCREASED METAL INTERCONNECT RELIABILITY IN SITU FORMATION OF TITANIUM ALUMINIDE

BACKGROUND OF THE INVENTION

1. The Field of the Invention

The present invention relates to the formation of metal interconnect stacks. More particularly, the present invention relates to the formation of titanium aluminide during the sputtering of the metal interconnect stack to improve metallization performance and reliability.

2. The Relevant Technology

Integrated circuits are manufactured by an elaborate process in which a variety of different electronic devices are integrally formed on a small silicon wafer. Conventional electronic devices include capacitors, resistors, transistors, diodes, and the like. In advanced manufacturing of integrated circuits, hundreds of thousands of electronic devices are formed on a single wafer.

One of the steps in the manufacture of integrated circuits is to form metal interconnect lines between the discrete electronic devices on the integrated circuit. The metal interconnect lines allow for an electrical current to be delivered to and from the electronic devices so that the integrated circuit can perform its intended function.

The metal interconnect lines generally comprise narrow lines of aluminum. Aluminum is typically used because it has a relatively low resistivity, good current-carrying density, superior adhesion to silicon dioxide, and is available in high parity. Each of these properties is desirable in contact lines since they result in a quicker and more efficient electronic circuit.

The computer industry is constantly under market demand to increase the speed at which integrated circuits operate and to decrease the size of integrated circuits. To accomplish this task, the electronic devices on a silicon wafer are continually being increased in number and decreased in dimension. In turn, the dimension of the metal interconnect lines must also be decreased. This process is known as miniaturization.

Metal interconnect lines are now believed to be one of the limiting factors in the miniaturization of integrated circuits. It has been found, however, that by using more than one level in the interconnect, the average interconnect link is reduced and with it the space required on the integrated circuit. Thus, integrated circuits can further be reduced in size. These multi-level metals are referred to as metal interconnect stacks, named for the multiple layers of different metal, such as titanium/aluminum/titanium nitride, which are stacked on top of each other. The metal interconnect stacks are formed by repeating the techniques used to form the planar metal interconnect lines. For example, after patterning a first metal level, another inter-level dielectric can be deposited and planarized, followed by via and third metal patterning, and so on. Aluminum has been found to be well suited for the upper levels in these metal interconnect stacks.

As heat treatments following metal deposition steps get longer and higher temperatures occur, a phenomenon referred to as "void formation" has been found to occur more frequently. In general, void formation is a process in which minute voids formed within the metal stack of the metal interconnect line coalesce at flux divergence sites, such as grain boundary triple points, of the metal interconnect line. As a result of the coalescing of the voids, the aluminum in the line begins to narrow at a specific location. If the aluminum gets sufficiently narrow, the metal interconnect line can void out so as to cause a gap in the line. Such a gap results in an open circuit condition and prevents the integrated circuit from operating in a proper manner.

Void formation is generally caused by either electromigration or stress migration. Electromigration occurs as an electrical current flows through an aluminum portion of an interconnect line. When a voltage is applied across the aluminum, electrons begin to flow through the aluminum. These electrons impart energy to the aluminum atoms sufficient to eject aluminum atoms from their lattice sites. As the aluminum atoms become mobile, they leave behind vacancies. In turn, the vacancies are also mobile, since they can be filled by other aluminum atoms which then open new vacancies. In the phenomenon of electromigration, the vacancies formed throughout the aluminum line tend to coalesce at flux divergence sites such as gain boundary triple points of the metal line, thereby forming voids that narrow the metal interconnect line as discussed above.

Once the metal interconnect line is narrowed, the current density passing through that portion of the line is increased. As a result, the increased current density accelerates the process of electromigration, thereby continually narrowing the line until the line fails.

It is also thought that void formation occurs as a result of stress migration inherent in aluminum line deposition. The deposition of the aluminum in the metal interconnect lines is usually conducted at an elevated temperature. As the aluminum in the line cools, the aluminum begins to contract. The insulation layer positioned under the aluminum layer, typically silicon dioxide, also contracts. Because the aluminum and the silicon dioxide have different coefficients of thermal expansion and contraction, however, the two materials contract at different rates. This contraction sets an internal stress within the aluminum portions of the metal interconnect lines. The same phenomenon can also occur when a subsequent layer is formed over the top of the aluminum portions of the lines. It is theorized that the energy resulting from the induced stress within the aluminum causes displacement of the aluminum atoms and coalescence of the resulting vacancies.

A further problem introduced by the miniaturization of metal interconnect lines is stress induced by gain boundary "pinning." This pinning effect can lead to an increase in stress and further electromigration, along with an increase in film resistivity. Pinning occurs with polycrystalline materials such as titanium, which are formed of a microscopic grain structure. Since titanium has a much smaller gain structure than aluminum, when aluminum is deposited on to the titanium a much larger gain results on the surface, with much smaller grains being trapped underneath. During the final anneal the underlying layer shrinks and forms voids.

In one attempt to eliminate void formation, the aluminum is mixed with another metal to form an aluminum alloy. For example, copper has been added to aluminum. In turn, the copper appears to increase the energy required to cause the voids to form in the metal interconnect line. This remedy, however, is only partial, as void formation does occur over time, especially as the size of the metal interconnect line decreases. Titanium is also frequently deposited together with the aluminum and is alloyed to the aluminum with a high temperature anneal step.

Voids also form during post metal deposition anneals, which are typically conducted at temperatures of about 425° C. and for times of about 100 minutes. When Al is deposited on Titanium, the Titanium and Aluminum react to form TiAl$_x$. As a result, the stress in the metal line increases due to a volume loss that occurs because of the density change which occurs during the reaction of converting Titanium and Aluminum to TiAl$_x$. As a consequence, voids form to relieve the stress in the liner.

One method used in the prior art for forming metal interconnect stacks with titanium and aluminum comprises first depositing a titanium layer, then depositing an overlying aluminum film, after which a titanium nitride layer is deposited above the aluminum and titanium layer. Finally, an anneal is conducted in a furnace at about 425° C. for about 100 minutes to alloy the titanium and aluminum. The titanium-aluminum alloy is used in order to retain certain properties such as electromigration resistance for preventing migration failures. Nevertheless, the smaller grain size of the titanium-aluminum alloy results in a lower conductivity, and a volume loss is sustained during the anneal, accompanied by an increase in the tensile stress of the titanium-aluminum alloy that in some cases exceeds the yield strength of the alloy. This stress can result in voiding during the cooling that occurs after the anneal.

Thus, a need continues to exist in the art for a method of forming metal interconnection lines with an increased resistance to void formation and with a substantially larger grain size in order to reduce the electromigration and lower the resistivity of the metal for greater performance and reduced heat build-up. Such a method is also needed which will reduce the stress migration and volume loss of conventional methods.

SUMMARY AND OBJECTS OF THE INVENTION

The present invention seeks to resolve the above and other problems that have been experienced in the art. More particularly, the present invention constitutes an advancement in the art by providing a method for in situ formation of titanium aluminide which achieves each of the objects listed below.

It is an object of the present invention to provide a method for in situ formation of titanium aluminide which can be effectively used to form metal interconnect stacks with a high degree of miniaturization.

It is also an object of the present invention to provide a method for in situ formation of titanium aluminide which decreases the stress on the metal interconnect stack formed thereby, thus reducing void formation.

It is further an object of the present invention to provide such a method for in situ formation of titanium aluminide which eliminates the effects of pinning to further reduce void formation.

These and other objects, features, and advantages of the present invention will become more fully apparent from the following description and appended claims, or may be learned by the practice of the invention as set forth hereinafter.

To achieve the foregoing objects, and in accordance with the invention as embodied and broadly described herein, a method is provided for in situ formation of titanium aluminide which overcomes the problems in the art of void formation in titanium-aluminum metal interconnect stacks, thereby improving metallization performance and reliability.

The first step of the method of the present invention comprises providing a silicon substrate upon which the metal interconnect stack is to be formed. This typically comprises forming a P-type silicon substrate on an in-process integrated circuit wafer. Under the method of the present invention, a passivation layer is then formed on the silicon substrate. The passivation layer typically comprises silicon dioxide. Next, a layer of titanium is deposited over the passivation layer. An aluminum film is then deposited over the titanium layer with a thickness of between about 2.5 to 3 times the thickness of the titanium layer. Preferably, the aluminum film has a thickness of approximately 2.8 times the thickness of the titanium layer.

As a next step, the wafer is sealed in an anneal chamber in situ in a cluster tool or as part of the chamber wherein the deposition is taking place. This intermediate step anneal is typically conducted at a temperature of greater than about 450° C. and for a time of about 4 to 6 minutes, depending on the thickness of the titanium layer, to completely (e.g. substantially) react the titanium and aluminum and thereby form a titanium aluminide layer. This intermediate anneal step and pre-forming of the titanium aluminide layer avoids the problems in the prior art of pinning of the underlying aluminum and titanium during the final step anneal of the prior art.

The next step under the method of the present invention comprises the deposition of an overlying conducting material which typically comprises the remainder of the required aluminum to form the remainder of the metal interconnect stack. This is typically conducted with a sputtering process. As a result of the prior formation of the titanium aluminide layer with the intermediate anneal, the overlying conducting material, when comprising aluminum, does not substantially react with the titanium aluminide layer.

The next step comprises the deposition of an ARC (anti-reflective coating) layer above the overlying conducting material. This is also typically conducted with a sputtering process. Finally, the wafer undergoes an anneal process such as that of the prior art, which is conducted in a furnace at conventional temperatures and for a conventional amount of time. This helps to adhere the layers to each other and cure defects within the layers.

Thus, a method is provided for forming metal interconnect stacks which overcomes the problems of the prior art. Specifically, the method of the present invention overcomes the problems of void formation due to volume loss and stress within the layers of the metal interconnect stack by pre-forming the titanium aluminide prior to aluminum deposition. Furthermore, the overlying conducting layer, when formed of aluminum is not substantially reacted with the titanium and maintains its large grain size, providing further resistance to electromigration, greater conductivity, and greater reliability.

BRIEF DESCRIPTION OF THE DRAWINGS

In order that the manner in which the above-recited and other advantages and objects of the invention are obtained will be understood, a more particular description of the invention briefly described above will be rendered by reference to a specific embodiment thereof which is illustrated in the appended drawings. Understanding that these drawings depict only a typical embodiment of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention is based upon the discovery by the inventor that a metal interconnect stack can be formed with a corresponding substantial elimination of voiding by conducting an intermediate anneal step in situ in a metal anneal chamber to form an underlying layer of titanium aluminide. The remainder of the aluminum needed for proper conductivity is later deposited over the titanium aluminide but does not substantially react with the titanium aluminide so as to result in pinning. Thus, the present invention comprises a method for the in situ formation of metal interconnect stacks which improves metallization performance and reliability.

Figure 1:
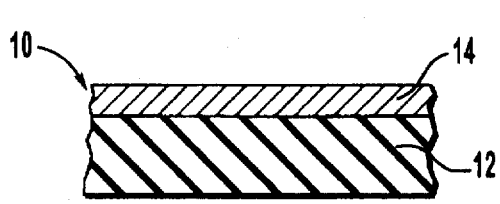
FIG. 1 is a cross-sectional view of a section of a silicon substrate of an in-process integrated circuit wafer showing formed on the silicon substrate a layer of silicon dioxide as a passivation layer as a result of one step of the method of the present invention.
Figure 2:
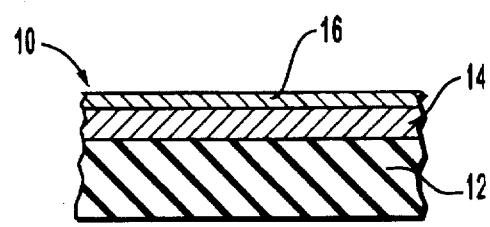
FIG. 2 is a cross-sectional depiction of the silicon substrate of FIG. 1 showing formed over the passivation layer a titanium layer as a result of a further step of the method of the present invention.
Figure 3:
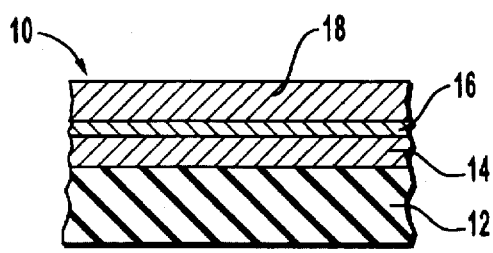
FIG. 3 is a cross-sectional depiction of the silicon substrate of FIG. 2 showing an aluminum film deposited above the titanium layer as a result of another step of the method of the present invention.

The first step of the method of the present invention is shown in FIG. 1 and comprises the deposition of a passivation layer 14 over an underlying silicon substrate 12 on an in-process integrated circuit wafer 10. Passivation layer 14 preferably comprises silicon dioxide ($SiO_2$). The next step of the method of the present invention is shown in FIG. 2 and involves the deposition of a layer of titanium 16 above passivation layer 14. Titanium layer 16 is preferably deposited with a sputtering technique. The next step of the method of the present invention is shown in FIG. 3 and comprises the deposition of an aluminum film 18 above titanium layer 16. Aluminum film 18 is preferably deposited with a sputtering technique and has a thickness preferably of between about 2 and 4 times the thickness of titanium layer 16. Most preferably, aluminum film 18 has a thickness that is three times the thickness of titanium layer 16.

Figure 4:
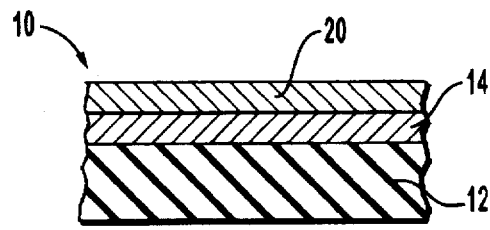
FIG. 4 is a cross-sectional depiction of the silicon substrate of FIG. 3 showing a titanium aluminide layer formed above the passivation layer as a result of an intermediate anneal step of the method of the present invention.

The next step in the method of the present invention is shown in FIG. 4 and comprises an intermediate anneal step. As used herein, the term "intermediate anneal" is intended to mean an anneal which is conducted before the entire metallization stack is formed. This is in contrast to the conventional method, which anneals only after the metal interconnect stack has been formed. The intermediate anneal step is preferably conducted in situ in an anneal chamber and is conducted at a temperature and for a sufficient amount of time to substantially react titanium layer 16 and aluminum film 18 to form a layer of titanium aluminide ($TiAl_3$) 20 along with other less occurring compounds, examples of which are $TiAl_2$ and $TiCu_4$. Preferably, the intermediate anneal is conducted at a temperature of greater than about 450° and for a time of between about 4 and 6 minutes, depending on the titanium layer thickness. An example of a tool by which the intermediate anneal of the inventive method can be accomplished in situ is the Endura HP PVD manufactured by Applied Materials, of Boise, Id. As referred to herein, in situ means that the anneal is conduced without transferring the wafer out of the immediate deposition chamber or cluster tool and into ambient.

In so doing, rather than moving the wafer to the anneal chamber, after the first aluminum deposition, the wafer stays in the chamber for a given amount of time at temperatures above 400° C. to completely react the titanium and aluminum..

The metal anneal chamber is typically part of a cluster tool or can be integral to the deposition chamber, and the chamber is provided with the capability of varying the pressure around the wafer such that a low pressure can be utilized in the anneal. The metal anneal chamber is also provided with lamps for heating the sample to a given temperature for a given amount of time.

Figure 5:
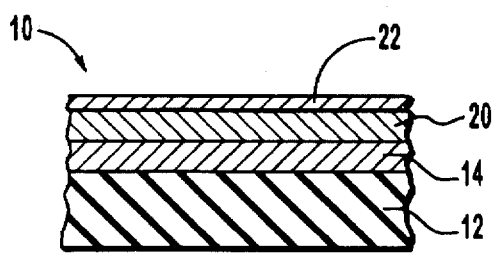
FIG. 5 is a cross-sectional depiction of the silicon substrate of FIG. 4 showing formed above the titanium aluminide layer a further conducting layer as a result of another step of the method of the present invention.
Figure 6:
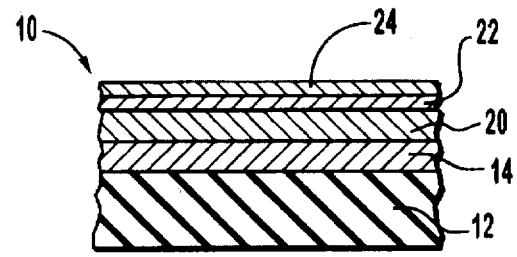
FIG. 6 is a cross-sectional depiction of the silicon substrate of FIG. 5 showing formed above the further conducting layer a titanium nitride layer as a result of a further step of the method of the present invention.

The next step of the method of the present invention is depicted in FIG. 5 and comprises depositing a further conducting layer 22, preferably an aluminum film, over titanium aluminide layer 20. Conducting layer 22 is deposited in an amount sufficient for the conductivity needed for the application utilizing the metal interconnect line that is being formed. Conducting layer 22 and titanium aluminide layer 20 are also selected to be in the proper proportions to sufficiently avoid migration failure.

The next step of the prior art is shown in FIG. 4 and comprise the deposition of a layer of titanium nitride 24 above conducting layer 22. Titanium nitride layer 24 performs the function of an ARC (anti-reflective coating) layer.

A further step after the deposition of titanium nitride layer 24 comprises a secondary anneal of the entire wafer in a furnace in order to cure any defects within the deposited materials and to adhere each of the materials properly to each other. The secondary anneal is typically conducted after patterning and etching, or even further down the processing line, and is conducted in substantially the same manner as the anneal of the aforementioned conventional method.

Due to the intermediate anneal and subsequent formation of titanium aluminide layer 20, conducting layer 22 will not substantially react with overlying titanium nitride layer 24 during the secondary anneal. As a result, volume loss due to pinning is avoided, and stress in the underlying aluminide layer 22 is significantly reduced compared to layers of titanium and aluminum which have not been annealed. Voiding is thereby substantially remedied.

A further advantage of the present invention is that conducting layer 22, when formed with aluminum, retains a large grain size. This occurs because conducting layer 22 does not substantially react with underlying titanium aluminide layer 20. As a result, electromigration is substantially reduced and voiding failures which might occur as a consequence of electromigration are thereby avoided. The larger grain size is also thought to result in higher conductivity.

The method of the present invention is useful in any situation where a metal stack that employs an aluminum film with a titanium underlayer is necessary. As a consequence of the method of the present invention wherein the titanium aluminide is pre-formed in an intermediate anneal step before the deposition of the remainder of the metallization, a decrease in the line stress is seen because less aluminum is being consumed during the secondary anneal.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for formation of titanium aluminide comprising:

providing a silicon substrate;

depositing a titanium layer of a first thickness over the silicon substrate;

depositing an aluminum film of a second thickness over the titanium layer, the second thickness being approximately two to four times greater than the first thickness;

conducting an intermediate anneal of the titanium layer and the aluminum film to form a titanium aluminide layer; and depositing a further conducting layer directly over the titanium aluminide layer.

2. A method as recited in claim 1, further comprising providing a passivation layer on the silicon substrate previous to the deposition of the titanium layer, and wherein the titanium layer is deposited directly over the passivation layer.

3. A method as recited in claim 1, wherein depositing an aluminum film of a second thickness over the titanium layer and conducting an intermediate anneal are both conducted in the same processing tool without moving the silicon substrate into the ambient between depositing an aluminum film and conducting an intermediate anneal, whereby the intermediate anneal is conducted in situ.

4. A method as recited in claim 1, wherein the further conducting layer comprises aluminum.

5. A method as recited in claim 1, wherein a layer of titanium nitride is deposited over the further conducting layer.

6. A method as recited in claim 1, further comprising conducting a secondary anneal of the silicon substrate subsequent to depositing the further conducting layer.

7. A method as recited in claim 3, wherein the intermediate anneal is conducted at a temperature greater than about 350° C.

8. A method as recited in claim 3, wherein the titanium layer and the aluminum film substantially react to form titanium aluminide, and wherein the titanium layer and the aluminum film are substantially consumed thereby.

9. A method for formation of titanium aluminide comprising:

providing a silicon substrate;

depositing a titanium layer of a first thickness over the silicon substrate;

depositing an aluminum film of a second thickness over the titanium layer, the second thickness being approximately two to four times greater than the first thickness;

conducting an intermediate anneal of the titanium layer and the aluminum film in a chamber wherein depositing an aluminum film over the titanium layer is conducted and without moving the silicon substrate into the ambient between depositing an aluminum film and conducting an intermediate anneal, whereby the intermediate anneal is conducted in situ, and wherein the intermediate anneal substantially reacts the titanium layer and the aluminum to form a titanium aluminide layer; and depositing a further conducting layer directly over the titanium aluminide layer.

10. A method as recited in claim 9, further comprising providing a passivation layer on the silicon substrate previous to the deposition of the titanium layer, and wherein the titanium layer is deposited directly over the passivation layer.

11. A method as recited in claim 9, wherein the further conducting layer comprises aluminum.

12. A method as recited in claim 11, further comprising forming a layer of titanium nitride over the further conducting layer.

13. A method as recited in claim 12, further comprising conducting a secondary anneal of the silicon substrate subsequent to forming the titanium nitride layer.

14. A method as recited in claim 9, wherein the intermediate anneal is conducted at a temperature greater than about 350° C.

15. A method as recited in claim 14, wherein the intermediate anneal is conducted for a sufficient amount of time to substantially react the titanium of the titanium layer and the aluminum of the aluminum film, and wherein the titanium layer and the aluminum film are substantially consumed by the reaction of the titanium and the aluminum.

16. A method for in situ formation of titanium aluminide comprising:

providing a silicon substrate on a semiconductor wafer;

providing a passivation layer on the silicon substrate;

sputtering a titanium layer of a first given thickness directly over the passivation layer;

sputtering an aluminum film over the titanium layer, the aluminum film having a second thickness in the range of between about two and four times the thickness of the titanium layer;

conducting an intermediate anneal of the titanium layer and the aluminum film in a chamber where the step of sputtering an aluminum film over the titanium layer is conducted without moving the silicon substrate into the ambient between these two steps, whereby the intermediate anneal step is conducted in situ, and where the intermediate anneal step substantially reacts the titanium of the titanium layer and the aluminum of the aluminum film to form a titanium aluminide layer, and wherein the titanium layer and the aluminum film are substantially consumed by the reaction of the titanium and the aluminum;

sputtering a further conducting material comprising a second aluminum film over the titanium aluminide layer;

sputtering a layer of titanium nitride over the second aluminum film; and conducting a secondary anneal of the semiconductor wafer.

17. A method for formation of titanium aluminide comprising:

providing a silicon substrate;

depositing a titanium layer over the silicon substrate;

depositing an aluminum film over the titanium layer;

conducting an intermediate anneal of the titanium layer and the aluminum film to form a titanium aluminide layer, wherein depositing an aluminum film over the titanium layer and conducting an intermediate anneal are both conducted in the same processing tool without moving the silicon substrate into the ambient between depositing an aluminum film and conducting an intermediate anneal, whereby the intermediate anneal step is conducted in situ, wherein the intermediate anneal is conducted for a sufficient amount of time to substantially react the titanium and aluminum; and depositing a further conducting layer directly over the titanium aluminide layer.

* * * * *

UNITED STATES PATENT AND TRADEMARK OFFICE
CERTIFICATE OF CORRECTION

PATENT NO. : 5,700,718
DATED : Dec. 23, 1997
INVENTOR(S) : Allen McTeer

It is certified that error appears in the above-identified patent and that said Letters Patent is hereby corrected as shown below:

Cover Page, left column, under U.S. Patent Documents change "Sawker" to --Saukar--

Col. 1, line 31, after "high" change "parity" to --purity--

Col. 2, line 34, after "contraction," delete --however,--

Col. 2, line 44, after "by" change "gain" to --grain--

Col. 2, line 49, after "smaller" change "gain" to --grain--

Col. 2, line 51, after "larger" change "gain" to --grain--

Col. 6, line 11, delete the second period

Col. 6, line 29, after "FIG." change "4" to --6--

Col. 6, line 45, after "the" change "underlying aluminide layer 22" to -- underlying titanium aluminide layer 20--

Signed and Sealed this

Twenty-third Day of February, 1999

Attest:

Q. TODD DICKINSON

*Attesting Officer*   *Acting Commissioner of Patents and Trademarks*